(12) United States Patent
Chen et al.

(10) Patent No.: US 8,362,484 B2
(45) Date of Patent: Jan. 29, 2013

(54) OPTICAL SENSOR, METHOD OF MAKING THE SAME, AND DISPLAY PANEL HAVING OPTICAL SENSOR

(75) Inventors: Shin-Shueh Chen, Hsin-Chu (TW); Wan-Yi Liu, Hsin-Chu (TW); Chia-Tien Peng, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 683 days.

(21) Appl. No.: 12/534,162

(22) Filed: Aug. 3, 2009

(65) Prior Publication Data

US 2010/0244033 A1 Sep. 30, 2010

(30) Foreign Application Priority Data

Mar. 24, 2009 (TW) ................................. 98109601 A

(51) Int. Cl.
H01L 31/101 (2006.01)
H01L 31/18 (2006.01)
H01L 33/00 (2010.01)

(52) U.S. Cl. ............................. 257/59; 257/461; 438/57

(58) Field of Classification Search .................. 257/461, 257/432, 428, E33.076, E31.054, 292, 462, 257/E31.003, E31.034, E31.031, 53, 55, 257/59, 225, 227, 257, 290, 431
See application file for complete search history.

(56) References Cited

U.S. PATENT DOCUMENTS

| | | | | |
|---|---|---|---|---|
| 3,524,064 A * | 8/1970 | Keyes | .................... | 250/214 LA |
| 4,830,890 A * | 5/1989 | Kanai | .................... | 427/255.39 |
| 5,417,770 A * | 5/1995 | Saitoh et al. | .................. | 136/258 |
| 5,466,617 A * | 11/1995 | Shannon | ........................ | 438/155 |
| 5,663,576 A * | 9/1997 | Shimizu | ........................ | 257/59 |
| 5,668,390 A * | 9/1997 | Morimoto | ........................ | 257/232 |
| 5,994,157 A * | 11/1999 | Aggas et al. | ........................ | 438/30 |
| 6,184,158 B1 * | 2/2001 | Shufflebotham et al. | ...... | 438/788 |
| 6,489,213 B1 * | 12/2002 | Hsueh et al. | ................... | 438/382 |
| 6,919,282 B2 * | 7/2005 | Sakama et al. | ................. | 438/769 |
| 7,098,085 B2 * | 8/2006 | Yamanaka et al. | ............. | 438/149 |
| 7,968,885 B2 * | 6/2011 | Kobayashi et al. | .............. | 257/66 |
| 2003/0116270 A1 | 6/2003 | Hawa | | |
| 2005/0117083 A1 | 6/2005 | Oh | | |
| 2006/0065943 A1 * | 3/2006 | Hill | ................................ | 257/442 |
| 2006/0102972 A1 * | 5/2006 | Bhattacharyya | ............... | 257/432 |
| 2006/0180816 A1 * | 8/2006 | Li et al. | ............................ | 257/79 |
| 2006/0189014 A1 * | 8/2006 | Li et al. | ............................ | 438/28 |
| 2006/0194454 A1 * | 8/2006 | Hughes et al. | ................. | 438/795 |
| 2006/0211267 A1 * | 9/2006 | Joshi et al. | ..................... | 438/778 |
| 2006/0237809 A1 * | 10/2006 | Bhattacharyya | ............... | 257/432 |
| 2007/0186970 A1 * | 8/2007 | Takahashi et al. | ............. | 136/255 |
| 2007/0194399 A1 * | 8/2007 | Bhattacharyya | ............... | 257/432 |

(Continued)

FOREIGN PATENT DOCUMENTS

TW 200417760 9/2004
TW 200527054 8/2005

(Continued)

*Primary Examiner* — Long Tran
*Assistant Examiner* — Jordan Klein
(74) *Attorney, Agent, or Firm* — Winston Hsu; Scott Margo

(57) ABSTRACT

An optical sensor, method of making the same, and a display panel having an optical sensor. The optical sensor includes a first electrode, a second electrode, a photosensitive silicon-rich dielectric layer, and a first interfacial silicon-rich dielectric layer. The photosensitive silicon-rich dielectric layer is disposed between the first and second electrodes. The first interfacial silicon-rich dielectric layer is disposed between the first electrode and the photosensitive silicon-rich dielectric layer.

28 Claims, 5 Drawing Sheets

U.S. PATENT DOCUMENTS

2008/0111204 A1* 5/2008 Yun ............................... 257/432
2008/0178794 A1* 7/2008 Cho et al. ...................... 117/103
2008/0179762 A1* 7/2008 Cho et al. .............. 257/E31.001
2009/0133753 A1* 5/2009 Sasaki et al. .................. 136/261
2009/0232449 A1* 9/2009 Zhang et al. .................... 385/31

FOREIGN PATENT DOCUMENTS

TW 200832516 8/2008

* cited by examiner

OPTICAL SENSOR, METHOD OF MAKING THE SAME, AND DISPLAY PANEL HAVING OPTICAL SENSOR

BACKGROUND OF THE INVENTION

1. Field of the Invention

The present invention relates to an optical sensor, a method of forming the same and a display panel having an optical sensor, and more particularly, to an optical sensor having a plurality of silicon-rich dielectric layers, a method of forming the same and a display panel having an optical sensor.

2. Description of the Prior Art

In recent years, optical sensors have been gradually applied to various kinds of display panels, and the display panel is endowed with other additional functions when sensing function is integrated therein. For example, the optical sensor can serve as an ambient light sensor (ALS) for detecting the intensity of the ambient light, such that the backlight intensity of the liquid crystal display (LCD) panel can be adjusted moderately as required. In another aspect, the applied optical sensor can be integrated into the display panel so as to ensure that the display panel can be endowed with a touch-input function.

Nevertheless, because the photocurrent versus light intensity curves of the optical sensors nowadays are unable to promise excellent linearity, errors tend to appear in various kinds of applications. In view of this, additional circuits are required to correct the relationship between the photocurrent and light intensity, and the cost inevitably increases.

SUMMARY OF THE INVENTION

One object of the present invention is to provide an optical sensor, a method of forming an optical sensor and a display panel for conquering the disadvantages of the conventional technique.

In order to achieve the above-mentioned object, the present invention proposes an optical sensor. The optical sensor includes a first electrode, a second electrode, a photosensitive silicon-rich dielectric layer and a first interfacial silicon-rich dielectric layer. The photosensitive silicon-rich dielectric layer is disposed between the first electrode and the second electrode. The first interfacial silicon-rich dielectric layer is disposed between the first electrode and the photosensitive silicon-rich dielectric layer.

In order to achieve the above-mentioned object, the present invention further proposes a method of forming an optical sensor. The method of forming an optical sensor includes following steps. A first electrode is provided; next, a first interfacial silicon-rich dielectric layer is formed on the first electrode; a photosensitive silicon-rich dielectric layer is formed on the first interfacial silicon-rich dielectric layer subsequently; and a second electrode is formed on the photosensitive silicon-rich dielectric layer afterwards.

In order to achieve the above-mentioned object, the present invention further proposes a display panel. The display panel includes a substrate, a thin film transistor and an optical sensor. The substrate has at least a thin film transistor region and at least an optical sensor region defined thereon. The thin film transistor is disposed in the thin film transistor region. The optical sensor is disposed in the optical sensor region, and the optical sensor includes a first electrode, a second electrode, a photosensitive silicon-rich dielectric layer and a first interfacial silicon-rich dielectric layer. The photosensitive silicon-rich dielectric layer is disposed between the first electrode and the second electrode. The first interfacial silicon-rich dielectric layer is disposed between the first electrode and the photosensitive silicon-rich dielectric layer.

The optical sensor of the present invention has a plurality of silicon-rich dielectric layers, where the photosensitive silicon-rich dielectric layer serves as a primary photosensitive layer, and the interfacial silicon-rich dielectric layers can improve the relationship between the photocurrent and light intensity of photosensitive silicon-rich dielectric layer. Consequently, the photocurrent versus light intensity curve of the optical sensor can behave in a highly linear manner. As a result, the precision of the optical sensor can be upgraded and the application of optical sensor integrated into display panels or other electronic products can also be increased.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be detailed as follows. The preferred embodiments of the present invention are illustrated in the accompanying drawings with numbered elements to elaborate the contents and effects to be achieved.

Figure 1:
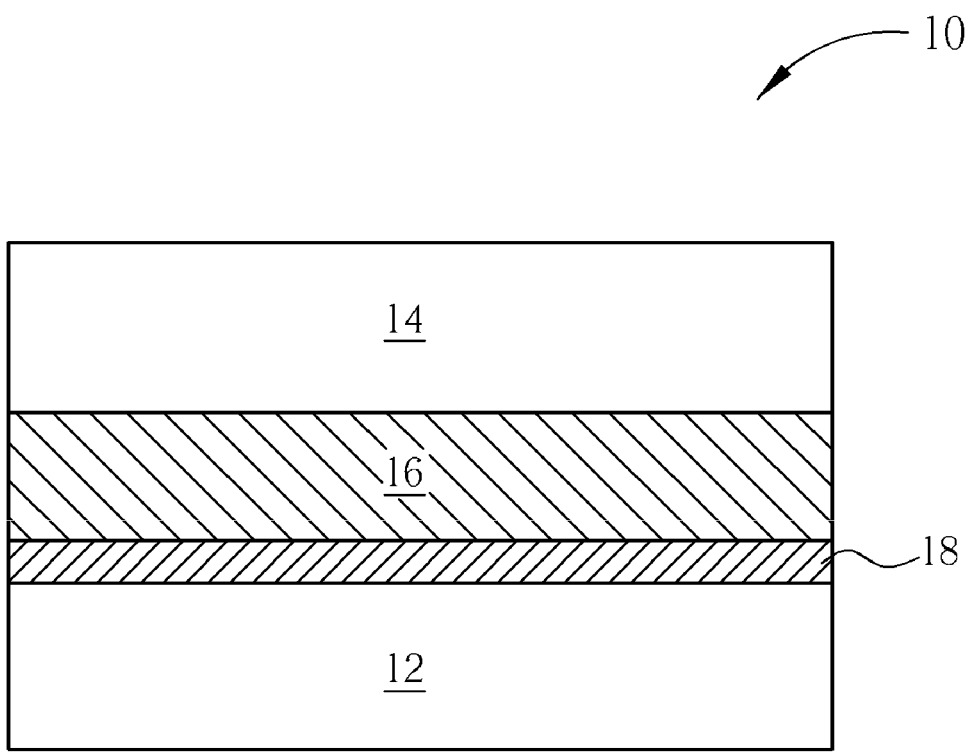
FIG. 1 is a schematic diagram illustrating a preferred embodiment of an optical sensor of the present invention.

With reference to FIG. 1, FIG. 1 is a schematic diagram illustrating a preferred embodiment of an optical sensor of the present invention. As illustrated in FIG. 1, the optical sensor 10, or named photo sensor, of this embodiment includes a first electrode 12, a second electrode 14, a photosensitive silicon-rich dielectric layer 16 and a first interfacial silicon-rich dielectric layer 18. In this embodiment, the first electrode 12 is an anode and the second electrode 14 is a cathode. In addition, the first electrode 12 includes a non-transparent electrode such as single layer electrode made of titanium or aluminum, or a composite electrode made of titanium and aluminum. The second electrode 14 includes a transparent electrode such as indium tin oxide (ITO) electrode, but not limited. The photosensitive silicon-rich dielectric layer 16 is disposed between the first electrode 12 and the second electrode 14, and the first interfacial silicon-rich dielectric layer 18 is disposed between the first electrode 12 and the photosensitive silicon-rich dielectric layer 16. The thickness of the photosensitive silicon-rich dielectric layer 16 is larger than that of the first interfacial silicon-rich dielectric layer 18. For example, the thickness of the photosensitive silicon-rich dielectric layer 16 is substantially between 500 angstroms and 4000 angstroms, and the thickness of the first interfacial silicon-rich dielectric layer 18 is substantially between 5 angstroms and 500 angstroms, but not limited.

Both the photosensitive silicon-rich dielectric layer 16 and the first interfacial silicon-rich dielectric layer 18 of the present invention are essentially made of silicon, hydrogen and oxygen atoms, whereas and may further include nitrogen atoms or other atoms. In this embodiment, the molecular formula of the photosensitive silicon-rich dielectric layer 16 is $SiH_{W1}O_{X1}N_{Y1}$, and the preferred proportion of hydrogen and oxygen is that w1 is substantially in the range of 1.05<w1<1.41 and x1 is substantially in the range of 0.39<x1<0.47. Also, the proportion of nitrogen y1 is substantially in the range of 0≦y1≦1.33, and y1 is preferably in the range of 0.06<y1<0.08. In another aspect, the molecular formula of the first interfacial silicon-rich dielectric layer 18 is $SiH_{W2}O_{X2}N_{Y2}$, and the preferred proportion of hydrogen and oxygen is that w2 is substantially in the range of 1.15<w2<2.27 and x2 is substantially in the range of 0.29<x2<1.67. The proportion of nitrogen y2 is substantially in the range of 0≦y2≦1.33, and y2 is preferably in the range of 0.09<y2<0.18, but not limited. In this embodiment, the percentage range of hydrogen of the photosensitive silicon-rich dielectric layer 16 partially overlaps with the percentage range of hydrogen of the first interfacial silicon-rich dielectric layer 18, whereas the percentage of hydrogen of the first interfacial silicon-rich dielectric layer 18 has to be higher than the percentage of hydrogen of the photosensitive silicon-rich dielectric layer 16. Additionally, the impedance R1 of the photosensitive silicon-rich dielectric layer 16 is substantially in the range of 5E14<R1<5E17, and the refractive index n1 of the photosensitive silicon-rich dielectric layer 16 is substantially in the range of 2.7<n1<3.4; The impedance R2 of the first interfacial silicon-rich dielectric layer 18 is substantially in the range of 5E17<R2<5E19, and the refractive index n2 of the first interfacial silicon-rich dielectric layer 18 is substantially in the range of 2.2<n2<2.7. The impedance R1, the refractive index n1, the impedance R2 and refractive index n2 are not limited to the aforementioned range, and may be modified according to the variation of material composition or thicknesses, for instance.

Figure 2:
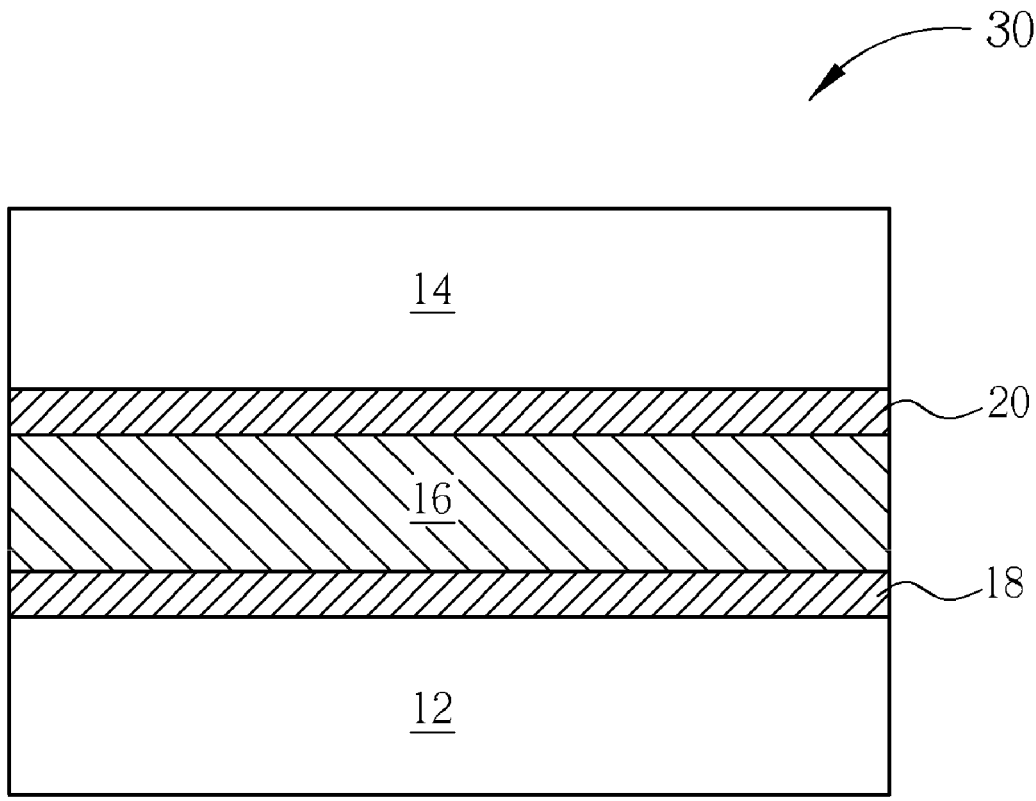
FIG. 2 is a schematic diagram illustrating another preferred embodiment of an optical sensor of the present invention.

With reference to FIG. 2, FIG. 2 is a schematic diagram illustrating another preferred embodiment of an optical sensor of the present invention. In this and the aforementioned embodiments, in order to compare the differences between the embodiments of the present invention with brevity, identical elements denoted by the same numerals indicate the same devices, and redundant description are no longer detailed. As illustrated in FIG. 2, the difference between this and the aforementioned embodiments is that the optical sensor 30 of this embodiment further includes a second interfacial silicon-rich dielectric layer 20 disposed between the photosensitive silicon-rich dielectric layer 16 and the second electrode 14. The second interfacial silicon-rich dielectric layer 20 is essentially made of silicon, hydrogen and oxygen atoms, and may further include nitrogen atoms or other atoms. The molecular formula of the second interfacial dielectric layer 20 is $SiH_{w3}O_{x3}N_{y3}$, and the preferred proportion of hydrogen and oxygen is that w3 is substantially in the range of 1.15<w3<2.27 and x3 is substantially in the range of 0.29<x3<1.67. The proportion of nitrogen y3 is substantially in the range of 0≦y3≦1.33, and preferably in the range of 0.09<y3<018. Although the percentage of hydrogen of the photosensitive silicon-rich dielectric layer 16 partially overlaps with the percentage of hydrogen of the second interfacial silicon-rich dielectric layer 20, the percentage of hydrogen of the second interfacial silicon-rich dielectric layer 20 has to be higher than the percentage of hydrogen of the photosensitive silicon-rich dielectric layer 16 in this embodiment.

The thickness of the second interfacial silicon-rich dielectric layer 20 is substantially between 5 angstroms and 500 angstroms, but not limited. Also, the impedance R3 of the second interfacial silicon-rich dielectric layer 20 is substantially in the range of 5E17<R3<5E19, and the refractive index n3 of the second interfacial silicon-rich dielectric layer 20 is substantially in the range of 2.2<n3<2.7. The impedance R3 and the refractive index n3 of the second interfacial silicon-rich dielectric layer 20, however, may be modified according to the variations of material composition or thickness, for instance.

Figure 3:
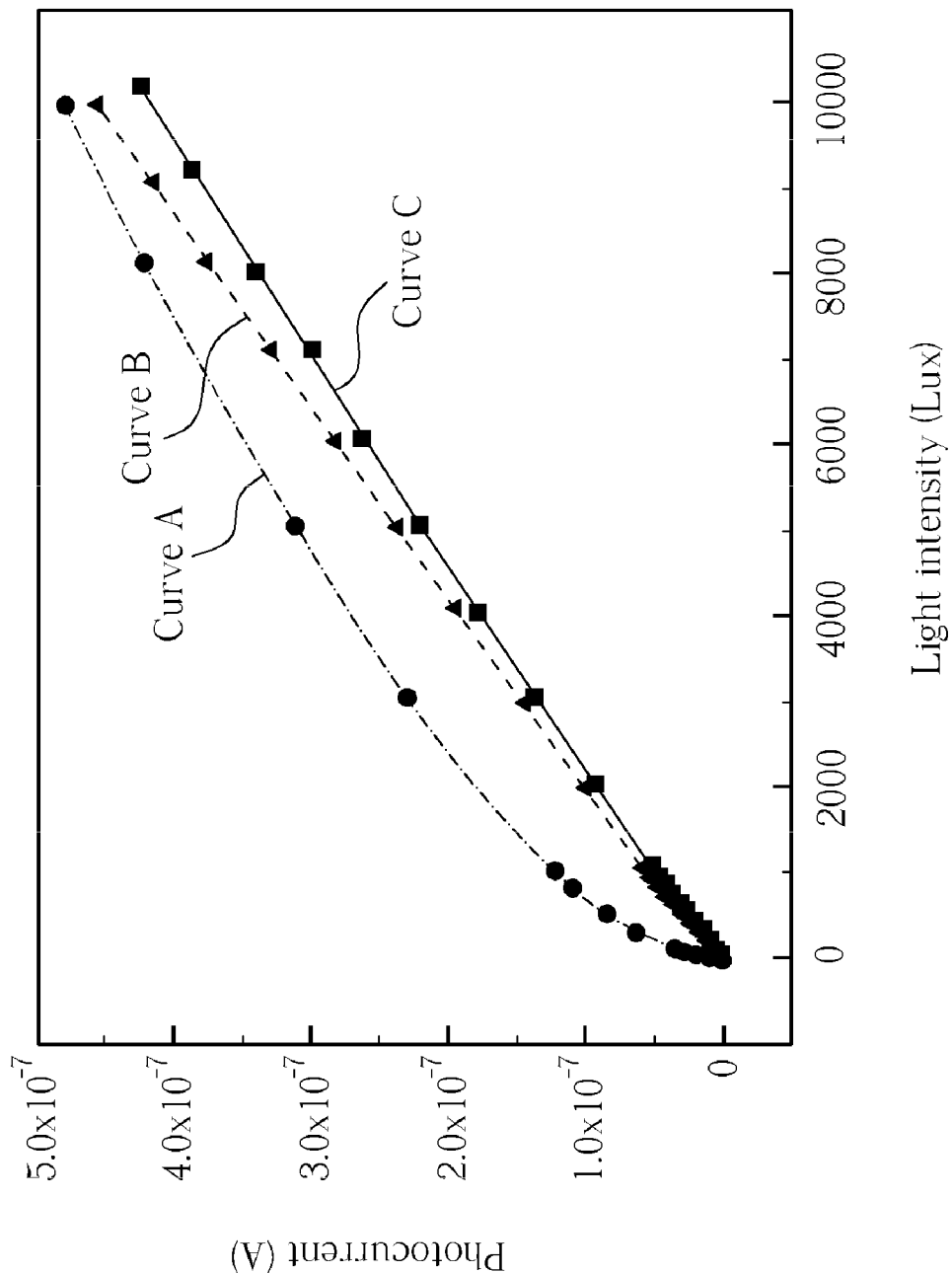
FIG. 3 is a diagram depicting a relationship between photocurrent and light intensity of an optical sensor of the present invention.

With reference to FIG. 3, FIG. 3 is a diagram depicting a photocurrent versus light intensity curve of an optical sensor of the present invention. Curve A shown in FIG. 3 illustrates a relationship between the photocurrent versus light intensity of an optical sensor only having a photosensitive silicon-rich dielectric layer integrated therein; curve B illustrates a relationship between the photocurrent versus light intensity of an optical sensor having both a photosensitive silicon-rich dielectric layer and a first interfacial silicon-rich dielectric layer; and curve C illustrates a relationship between the photocurrent versus light intensity of an optical sensor having a photosensitive silicon-rich dielectric layer, a first interfacial silicon-rich dielectric layer and a second interfacial silicon-rich dielectric layer. As illustrated in FIG. 3, in comparison with the relationship between the photocurrent and light intensity shown in curve A of an optical sensor which only has a photosensitive silicon-rich dielectric layer, both the relationship between the photocurrent and light intensity shown in curve B of an optical sensor which has both a first interfacial silicon-rich dielectric layer and a second interfacial silicon-rich dielectric layer and the relationship between the photocurrent and light intensity shown in curve C of an optical sensor which has a photosensitive silicon-rich dielectric layer, a first interfacial silicon-rich dielectric layer and a second interfacial silicon-rich dielectric layer obviously show preferable linearity. As a result, the precision and accuracy of the optical sensor can be upgraded, the application of the optical sensor can be increased, and the cost of additional signal correction circuits is reduced.

The optical sensor of the present invention has a silicon-rich dielectric layer with a composite structure, and all of the photosensitive silicon-rich dielectric layer 16, the first interfacial silicon-rich dielectric layer 18 and the second interfacial silicon-rich dielectric layer 20 have photosensitive characteristics, whereas substantially have distinguishing compositions and thicknesses. In view of the discrepancy in aforementioned compositions and thicknesses, for example, the lower hydrogen percentage in the photosensitive silicon-rich dielectric layer 16 than that in the first interfacial silicon-rich dielectric layer 18 and that in the second interfacial silicon-rich dielectric layer 20, and the larger thickness of the photosensitive silicon-rich dielectric layer 16 than that of the first interfacial silicon-rich dielectric layer 18 and that of the second interfacial silicon-rich dielectric layer 20, the impedance R1 of the photosensitive silicon-rich dielectric layer 16 is accordingly lower than both the impedance R2 of the first interfacial silicon-rich dielectric layer 18 and the impedance R3 of the second interfacial silicon-rich dielectric layer 20. The lower impedance R1 makes the photosensitive silicon-rich dielectric layer 16 generate larger photocurrent when illuminated, whereas the relationship between the photocurrent and light intensity can not behave in a linear manner especially when weakly illuminated. The first interfacial silicon-rich dielectric layer 18 and the second interfacial silicon-rich dielectric layer 20 with higher impedance integrated into the optical sensor are able to modify the photocurrent versus light intensity curve of the optical sensor, thereby rendering the optical sensor excellent linearity.

Figure 4:
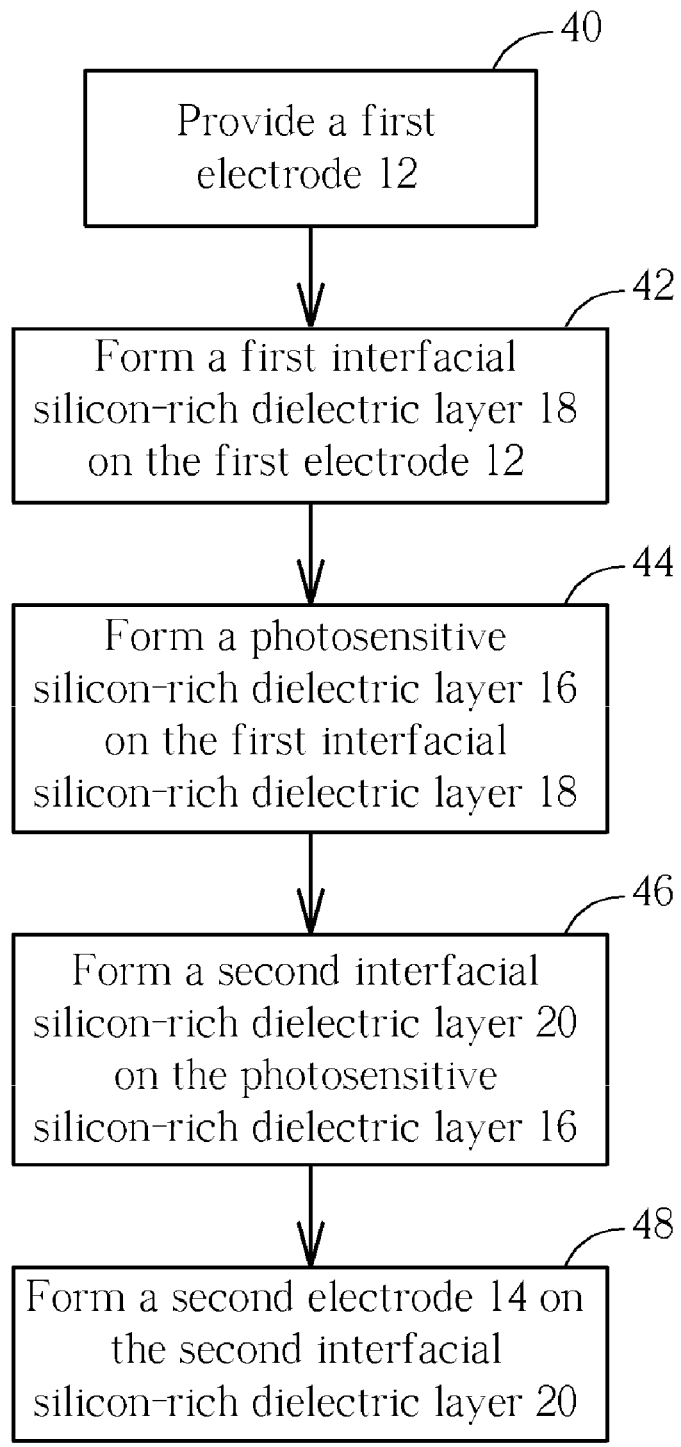
FIG. 4 is a flowchart illustrating a preferred embodiment of a method of forming an optical sensor of the present invention.

Refer to FIG. 4, FIG. 1 and FIG. 2. FIG. 4 is a flowchart illustrating a preferred embodiment of a method of forming an optical sensor of the present invention. As illustrated in FIG. 4, the method of forming an optical sensor of the present invention includes following steps:

Step 40: provide a first electrode 12;

Step 42: form a first interfacial silicon-rich dielectric layer 18 on the first electrode 12;

Step 44: form a photosensitive silicon-rich dielectric layer 16 on the first interfacial silicon-rich dielectric layer 18;

Step 46: form a second interfacial silicon-rich dielectric layer 20 on the photosensitive silicon-rich dielectric layer 16; and Step 48: form a second electrode 14 on the second interfacial silicon-rich dielectric layer 20.

In step 42, the method of forming the first interfacial silicon-rich dielectric layer 18 includes steps of performing a chemical vapor deposition (CVD) process such as plasma-enhanced chemical vapor deposition (PECVD) process, and introducing silane ($SiH_4$) and nitrous oxide ($N_2O$) during the PECVD process, where the gas flow rate ratio of $SiH_4/N_2O$ is 1.8. In step 44, the method of forming the photosensitive silicon-rich dielectric layer 16 includes steps of performing a CVD process such as PECVD process, and introducing $SiH_4$, $N_2O$ and hydrogen during the PECVD process, where the gas flow rate ratio of $SiH_4/N_2O$ is 1.8 and the gas flow rate of hydrogen is substantially 4500 sccm. Step 46 used for forming the second interfacial silicon-rich dielectric layer 20 is optional. For example, step 46 is omitted when forming the optical sensor 10 disclosed in the embodiment showed in FIG. 1, whereas step 46 is required when forming the optical sensor 30 disclosed in the embodiment showed in FIG. 2. In step 46, the method of forming the second interfacial silicon-rich dielectric layer 20 includes steps of performing a CVD process such as PECVD process, and introducing $SiH_4$ and $N_2O$ during the PECVD process, where the gas flow rate ratio of $SiH_4/N_2O$ is 1.8. In addition, the characteristics of the material composition, thicknesses, impedances and refractive indexes of the first interfacial silicon-rich dielectric layer 18, the photosensitive silicon-rich dielectric layer 16 and second interfacial silicon-rich dielectric layer 20 have been disclosed in the aforementioned embodiment, and therefore redundant description are no longer detailed.

Figure 5:
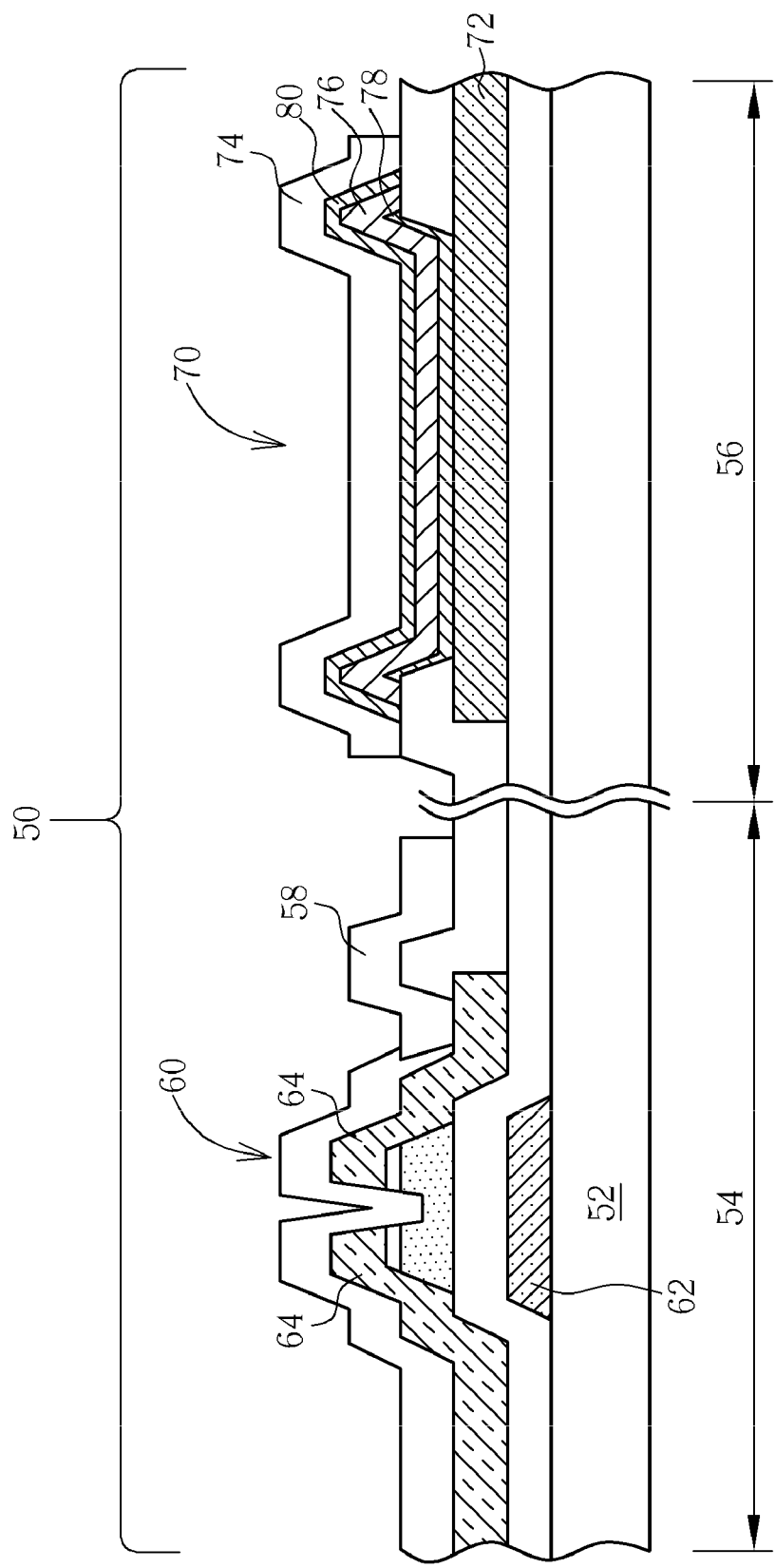
FIG. 5 is a schematic diagram illustrating a preferred embodiment of a display panel of the present invention.

With reference to FIG. 5, FIG. 5 is a schematic diagram illustrating a preferred embodiment of a display panel of the present invention. The display panel can be one of various kinds of display panels such as LCD panel, organic light emitting diode (OLED) display panel, electrophoretic display panel (EDP) or plasma display panel. As illustrated in FIG. 5, the display panel 50 of this embodiment includes a substrate 52, a pixel electrode 58, a thin film transistor 60 and an optical sensor 70. The substrate 52 has at least a thin film transistor region 54 and at least an optical sensor region 56 defined thereon. The thin film transistor 60 is disposed in the thin film transistor region 54, the thin film transistor 60 includes a gate electrode 62 and source/drain electrodes 64, and the source/drain electrodes 64 are electrically connected to the pixel electrode 58. The optical sensor 70 disposed in the optical sensor region 56 includes a first electrode 72, a second electrode 74, a photosensitive silicon-rich dielectric layer 76 and a first interfacial silicon-rich dielectric layer 78, and the optical sensor 70 may optionally include a second interfacial silicon-rich dielectric layer 80. The first electrode 72 is disposed on the substrate 52, the photosensitive silicon-rich dielectric layer 76 is disposed between the first electrode 72 and the second electrode 74, the first interfacial silicon-rich dielectric layer 78 is disposed between the first electrode 72 and the photosensitive silicon-rich dielectric layer 76, and the second interfacial silicon-rich dielectric layer 80 is disposed between the photosensitive silicon-rich dielectric layer 76 and the second electrode 74. The optical sensor 70 of the display panel 50 of this embodiment can be any optical sensor disclosed in aforementioned embodiments, and the characteristics are detailed in the aforementioned embodiments.

In this embodiment, the second electrode 74 of the optical sensor 70 and the pixel electrode 58 can be the same transparent conductive pattern layer formed by virtue of the same photolithograph and etching process. Additionally, the first electrode 72 of the optical sensor 70 and the gate electrode 62 of the thin film transistor 60 can be the same metal pattern layer such as first metal layer (metal 1) formed by virtue of the same photolithograph and etching process. Or, the first electrode 72 of the optical sensor 70 and source/drain electrodes 64 of the thin film transistor 60 can be the same metal pattern layer such as second metal layer (metal 2) by virtue of the same photolithograph etching process, such that the steps of the processes can be minimized.

In summary, the optical sensor of the present invention utilizes a plurality of silicon-rich dielectric layers as photosensitive layers, such that the relationship between the photocurrent and light intensity of the optical sensor can be efficiently improved and corrected. Consequently, a photocurrent versus light intensity curve with highly linearity can be promised, and therefore the precision of the optical sensor can be upgraded, the application of the optical sensor integrated into display panels or other electronic products can be also increased.

Those skilled in the art will readily observe that numerous modifications and alterations of the device and method may be made while retaining the teachings of the invention.

What is claimed is:

1. An optical sensor, comprising:
 a first electrode;
 a second electrode;
 a photosensitive silicon-rich dielectric layer disposed between the first electrode and the second electrode; and
 a first interfacial silicon-rich dielectric layer disposed between the first electrode and the photosensitive silicon-rich dielectric layer;
 wherein a percentage of hydrogen of the first interfacial silicon-rich dielectric layer is higher than a percentage of hydrogen of the photosensitive silicon-rich dielectric layer, and an impedance R2 of the first interfacial silicon-rich dielectric layer is substantially larger than an impedance R1 of the photosensitive silicon-rich dielectric layer.

2. The optical sensor of claim 1, wherein a molecular formula of the photosensitive silicon-rich dielectric layer is $SiH_{w1}O_{x1}N_{y1}$, and substantially $1.05 < w1 < 1.41$, $0.39 < x1 < 0.47$, and $0 \leq y1 \leq 1.33$.

3. The optical sensor of claim 1, wherein a molecular formula of the first interfacial silicon-rich dielectric layer is $SiH_{w2}O_{x2}N_{y2}$, and w2 is substantially in the range of $1.15 < w2 < 2.27$, x2 is substantially in the range of $0.29 < x2 < 1.67$, and y2 is substantially in the range of $0 \leq y2 \leq 1.33$ respectively.

4. The optical sensor of claim 1, wherein the first electrode is a non-transparent electrode, and the second electrode is a transparent electrode.

5. The optical sensor of claim 1, wherein the impedance R1 of the photosensitive silicon-rich dielectric layer is substantially in the range of 5E14<R1<5E17, and the impedance R2 of the first interfacial silicon-rich dielectric layer is substantially in the range of 5E17<R2<5E19.

6. The optical sensor of claim 1, wherein a refractive index n1 of the photosensitive silicon-rich dielectric layer is substantially in the range of $2.7 < n1 < 3.4$, and a refractive index n2 of the first interfacial silicon-rich dielectric layer is substantially in the range of $2.2 < n2 < 2.7$.

7. The optical sensor of claim 1, wherein a thickness of the photosensitive silicon-rich dielectric layer is larger than a thickness of the first interfacial silicon-rich dielectric layer.

8. The optical sensor of claim 7, wherein the thickness of the photosensitive silicon-rich dielectric layer is substantially between 500 angstroms and 4000 angstroms, and the thickness of the first interfacial silicon-rich dielectric layer is substantially between 5 angstroms and 500 angstroms.

9. The optical sensor of claim 1, further comprising a second interfacial silicon-rich dielectric layer disposed between the photosensitive silicon-rich dielectric layer and the second electrode.

10. The optical sensor of claim 9, wherein a molecular formula of the second interfacial silicon-rich dielectric layer is $SiH_{W3}O_{X3}N_{Y3}$, and w3 is substantially in the range of 1.15<w3<2.27, x3 is substantially in the range of 0.29<x3<1.67, and y3 is substantially in the range of 0≦y3≦1.33 respectively.

11. The optical sensor of claim 9, wherein a thickness of the photosensitive silicon-rich dielectric layer is larger than a thickness of the second interfacial silicon-rich dielectric layer, the thickness of the photosensitive silicon-rich dielectric layer is substantially between 500 angstroms and 4000 angstroms, and the thickness of the second interfacial silicon-rich dielectric layer is substantially between 5 angstroms and 500 angstroms.

12. A method of forming an optical sensor, comprising:
providing a first electrode;
forming a first interfacial silicon-rich dielectric layer on the first electrode;
forming a photosensitive silicon-rich dielectric layer on the first interfacial silicon-rich dielectric layer; and
forming a second electrode on the photosensitive silicon-rich dielectric layer;
wherein a percentage of hydrogen of the first interfacial silicon-rich dielectric layer is higher than a percentage of hydrogen of the photosensitive silicon-rich dielectric layer, and an impedance R2 of the first interfacial silicon-rich dielectric layer is substantially larger than an impedance R1 of the photosensitive silicon-rich dielectric layer.

13. The method of forming an optical sensor of claim 12, wherein forming the first interfacial silicon-rich dielectric layer comprises steps of performing a plasma-enhanced chemical vapor deposition (PECVD) process, and introducing silane ($SiH_4$) and nitrous oxide ($N_2O$) during the PECVD process.

14. The method of forming an optical sensor of claim 13, wherein a gas flow rate ratio of $SiH_4/N_2O$ for the PECVD process is 1.8.

15. The method of forming an optical sensor of claim 12, wherein forming the photosensitive silicon-rich dielectric layer comprises steps of performing a PECVD process, and introducing $SiH_4$, $N_2O$ and hydrogen during the PECVD process.

16. The method of forming an optical sensor of claim 15, wherein a gas flow-rate ratio of $SiH_4/N_2O$ for the PECVDE process is 1.8, and a flow rate of hydrogen is substantially 4500 sccm.

17. The method of forming an optical sensor of claim 12, wherein a molecular formula of the first interfacial silicon-rich dielectric layer is $SiH_{W2}O_{X2}N_{Y2}$, and w2 is substantially in the range of 1.15<w2<2.27, x2 is substantially in the range of 0.29<x2<1.67, and y2 is substantially in the range of 0≦y2≦1.33 respectively.

18. The method of forming an optical sensor of claim 12, wherein a molecular formula of the photosensitive silicon-rich dielectric layer is $SiH_{W1}O_{X1}N_{Y1}$, and w1 is substantially in the range of 1.05<w1<1.41, x1 is substantially in the range of 0.39<x1<0.47, and y1 is substantially in the range of 0≦y1≦1.33 respectively.

19. The method of forming an optical sensor of claim 12, wherein the impedance R1 of the photosensitive silicon-rich dielectric layer is substantially in the range of 5E14<R1<5E17, and the impedance R2 of the first interfacial silicon-rich dielectric layer is substantially in the range of 5E17<R2<5E19.

20. The method of forming an optical sensor of claim 12, further comprising forming a second interfacial silicon-rich dielectric layer on the photosensitive silicon-rich dielectric layer firstly before forming the second electrode.

21. The method of forming an optical sensor of claim 20, wherein a molecular formula of the second interfacial silicon-rich dielectric layer is $SiH_{W3}O_{X3}N_{Y3}$, and w3 is substantially in the range of 1.15<w3<2.27, x3 is substantially in the range of 0.29<x3<1.67, and y3 is substantially in the range of 0≦y3≦1.33 respectively.

22. The method of forming an optical sensor of claim 20, wherein forming the second interfacial silicon-rich dielectric layer comprises steps of performing a PECVD process, and introducing $SiH_4$ and $N_2O$ during the PECVD process.

23. The method of forming an optical sensor of claim 22, wherein a gas flow rate ratio of $SiH_4/N_2O$ for the PECVD process is 1.8.

24. A display panel, comprising:
a substrate having at least a thin film transistor region and at least an optical sensor region defined thereon;
a thin film transistor disposed in the thin film transistor region; and
an optical sensor disposed in the optical sensor region, wherein the optical sensor comprises:
a first electrode disposed on the substrate;
a second electrode;
a photosensitive silicon-rich dielectric layer disposed between the first electrode and the second electrode; and
a first interfacial silicon-rich dielectric layer disposed between the first electrode and the photosensitive silicon-rich dielectric layer;
wherein a percentage of hydrogen of the first interfacial silicon-rich dielectric layer is higher than a percentage of hydrogen of the photosensitive silicon-rich dielectric layer, and an impedance R2 of the first interfacial silicon-rich dielectric layer is substantially larger than an impedance R1 of the photosensitive silicon-rich dielectric layer.

25. The display panel of claim 24, further comprising a second interfacial silicon-rich dielectric layer disposed between the photosensitive silicon-rich dielectric layer and the second electrode.

26. The display panel of claim 24, wherein the thin film transistor comprises a gate electrode, and the first electrode of the optical sensor and the gate electrode of the thin film transistor are in a same metal pattern layer.

27. The display panel of claim 24, wherein the thin film transistor comprises a source/drain electrode, and the first electrode of the optical sensor and the source/drain electrode of the thin film transistor are in a same metal pattern layer.

28. The display panel of claim 24, further comprising a pixel electrode, and the pixel electrode and the second electrode of the optical sensor are in a same transparent conductive pattern layer.

* * * * *